(12) United States Patent
Forthmann

(10) Patent No.: US 11,885,859 B2
(45) Date of Patent: Jan. 30, 2024

(54) PASSIVE SHIM TRAY FOR MAGNETIC RESONANCE EXAMINATION SYSTEM

(71) Applicant: KONINKLIJKE PHILIPS N.V., Eindhoven (NL)

(72) Inventor: Peter Forthmann, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 134 days.

(21) Appl. No.: 17/600,616

(22) PCT Filed: Apr. 1, 2020

(86) PCT No.: PCT/EP2020/059301
§ 371 (c)(1),
(2) Date: Oct. 1, 2021

(87) PCT Pub. No.: WO2020/201379
PCT Pub. Date: Oct. 8, 2020

(65) Prior Publication Data
US 2022/0171007 A1 Jun. 2, 2022

(30) Foreign Application Priority Data
Apr. 2, 2019 (EP) .................................. 19166707

(51) Int. Cl.
*G01R 33/3873* (2006.01)

(52) U.S. Cl.
CPC ................................ *G01R 33/3873* (2013.01)

(58) Field of Classification Search
CPC ............................ G01R 33/38; G01R 33/3802; G01R 33/3873; G01R 33/3875
See application file for complete search history.

(56) References Cited

U.S. PATENT DOCUMENTS

| | | | | |
|---|---|---|---|---|
| 5,003,266 A | * | 3/1991 | Palkovich | G01R 33/3873 324/319 |
| 5,389,909 A | * | 2/1995 | Havens | G01R 33/3873 335/298 |
| 5,635,839 A | * | 6/1997 | Srivastava | G01R 33/3873 324/318 |
| 5,999,076 A | | 12/1999 | Becker | |
| 8,575,934 B2 | | 11/2013 | Iwasa et al. | |
| 2003/0214300 A1 | | 11/2003 | Bommel | |
| 2007/0030004 A1 | | 2/2007 | Mulder | |
| 2008/0169813 A1 | | 7/2008 | Takamori | |
| 2013/0207657 A1 | | 8/2013 | Leskowitz | |
| 2017/0285121 A1 | * | 10/2017 | Aley | G01R 33/3873 |
| 2020/0264252 A1 | | 8/2020 | Fukui | |

FOREIGN PATENT DOCUMENTS

| | | |
|---|---|---|
| CN | 103576113 A | 2/2014 |
| GB | 2483854 A | 3/2012 |

OTHER PUBLICATIONS

International Search Report for PCT/EP2020/059301 filed Apr. 1, 2020.

* cited by examiner

*Primary Examiner* — Steven L Yeninas

(57) ABSTRACT

A shim tray (10) for a main magnet system of a magnetic resonance examination system comprises a plurality of shim pockets (11), of which an individual shim pocket has side walls (21, 42) forming an open channel (11). Two opposite lateral side walls (21) have insertion profiles (22) to receive an end shim-element (13) at least one open channel's end. Essentially the entire volume of the channel of the shim pocket is available to hold passive shim elements.

16 Claims, 3 Drawing Sheets

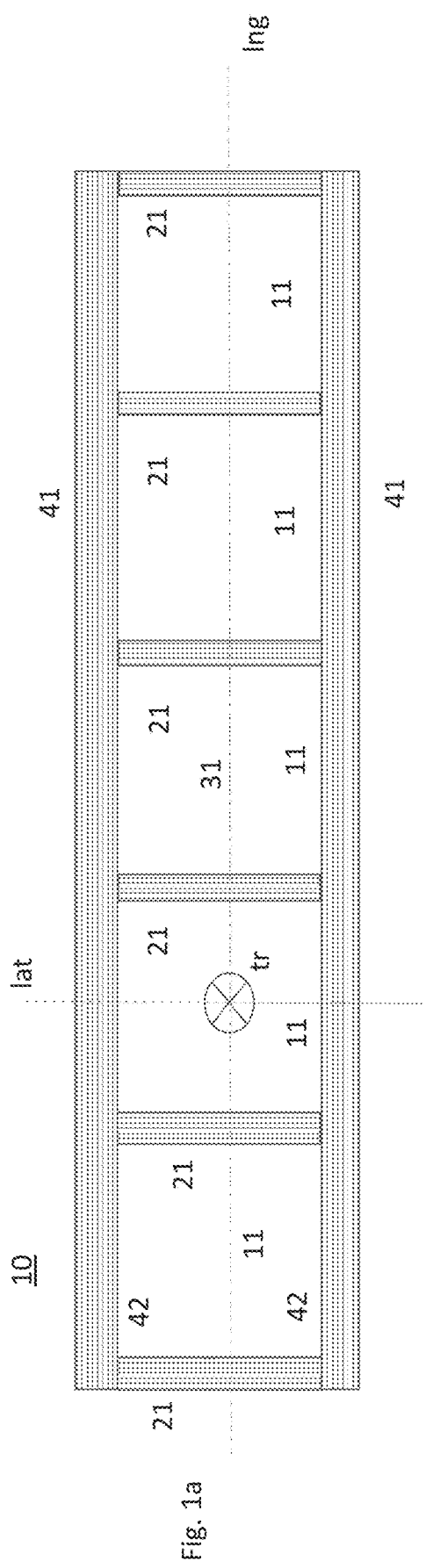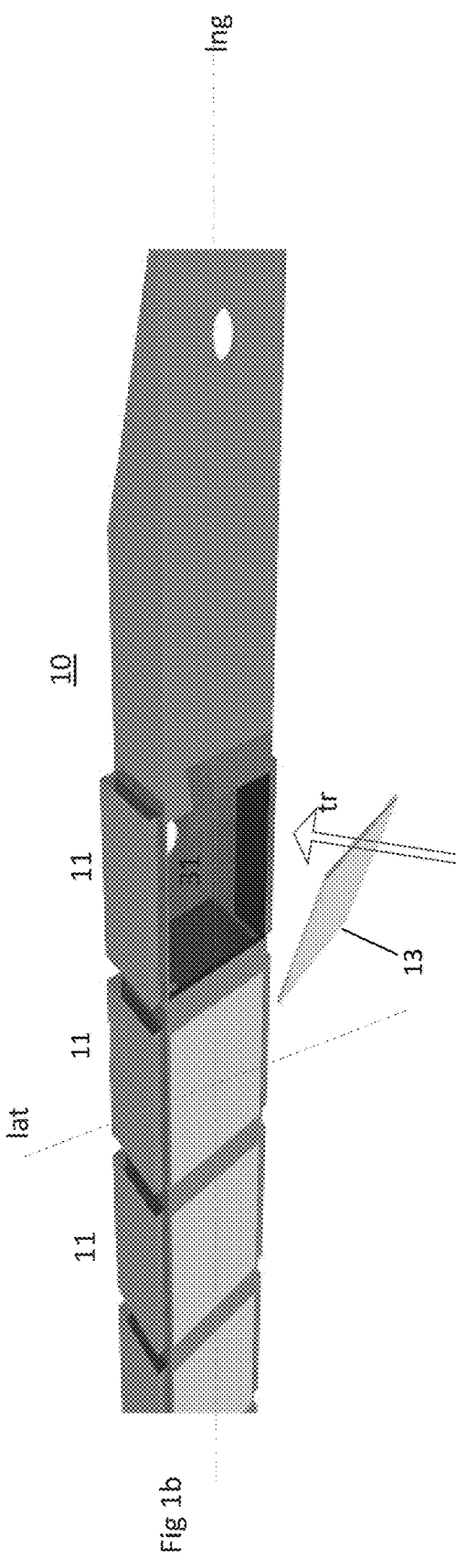

PASSIVE SHIM TRAY FOR MAGNETIC RESONANCE EXAMINATION SYSTEM

CROSS-REFERENCE TO PRIOR APPLICATIONS

This application is the U.S. National Phase application under 35 U.S.C. § 371 of International Application No. PCT/EP2020/059301, filed on Apr. 1, 2020, which claims the benefit of European Patent Application No. 19166707.0, filed on Apr. 2, 2019. These applications are hereby incorporated by reference herein.

FIELD OF THE INVENTION

The invention pertains to a shim tray for a main magnet system of a magnetic resonance examination system. For spatially resolved imaging or spectroscopy by the magnetic resonance examination system a spatially uniform strong main magnetic field is employed in the magnetic resonance examination system's examination region onto which temporary gradient magnetic field pulses are superposed. The spatially uniform main magnetic field causes a spatially homogeneous magnetic polarisation of the object to be examined (patient to be examined) and the temporary gradient magnetic field pulses provide for spatial encoding of the magnetic resonance signals.

The main magnetic field may have a field strength of 1.5, 3.0, 7.0T or even higher. In order to correct for spatial non-uniformities, so-called ferromagnetic shim elements (iron or steel) are mounted around the magnet bore. Usually a number of shim trays is arranged around the magnet's bore and each shim tray contains a number of shim pockets to hold a number of shim elements. The shim trays may slide longitudinally (along the direction of the main magnetic field) into their proper position so that the shim elements are correctly positioned.

BACKGROUND OF THE INVENTION

The US-patent application US200310214300 discloses a shim tray that is subdivided into the shim pockets in the axial direction that can be filled with shim laminae of magnetic material according the inhomogeneities of the magnetic field to be corrected. The US patent application US2007/0030004 discloses an MRI scanner with a molding containing shim packs.

SUMMARY OF THE INVENTION

An object of the invention is to provide a shim tray that has a higher shim capacity as compared to the known shim tray.

This object is achieved by the shim tray comprising a plurality of shim pockets, of which an individual shim pocket has side walls forming an open channel and two opposite lateral side walls have insertion profiles to receive an end shim-element at least one at open channel's end.

According to the invention, open channels form the individual shim pockets. Each of the shim pockets is covered at one or more of its channel ends by the end shim elements. The channels are open in that they may be freely accessible along the axis of the channel from one or both ends. Up to the top and/or bottom cover(s) such an individual channel may be filled with ferromagnetic end shim element(s) and ferromagnetic shim elements.

When the shim solution, i.e. the spatial configuration of shim elements to be mounted around the bore, does not require a pocket to be filled completely, magnetically inactive e.g. plastic dummy-shim plates are used to fill up the pocket, such that a pocket always contains a dense stack that secures the shim plates' positions. Hence, essentially the entire volume of the channel of the shim pocket is available to hold shim elements. The more volume is available, the more shim elements may be employed. This leads to a more accurate spatially uniform magnetic field. Due to the increased available shim volume, the shim tray of the invention may also enable adequate shim magnets that could not be properly shimmed with the conventional shim tray.

In order to hold the end shim element(s) mechanically in place, the channel's opposite longitudinal side walls have insertion profiles, notably near the channel's end(s). In this way, the end shim elements are held mechanically in positon and can withstand the magnetic forces when the shim tray is slid in position. Note that, e.g. during mounting, the shim tray is moved in a region (outside of the examination region) where the main magnetic field may have strong inhomogeneities so that magnetic forces of varying strength and orientations will act on the shim elements of the shim tray while slid longitudinally into position. The end shim element(s) are shaped so that their sides precisely lodge in the insertion profiles and the end shim elements may be laterally slid into the insertion profiles. Preferably the insertion profiles are provided at both channel ends and end shim elements are located at both channel ends inserted in their insertion profile. Alternatively, insertion profiles may be provided at one channel end and at the opposite channel end a conventional cover closes the open channel. In this alternative embodiment, the channel is an open channel with a single sided opening that may be closed by the end shim element. There are alternative geometries possible, in which in general the shim elements are polygon shaped and the orientation(s) of the insertion profiles matches with the polygon-shape to allow the polygon shaped shim elements to easily slide into the insertion profiles. Note that a rectangular or square four-sided shape works well, is easy to manufacture and the insertion profiles are easy to match.

A number of shim elements may be stacked into the channel having their normal along the channel's axis. These shim elements are held in place by the channel's side walls and the end shim elements. The end shim elements held in position in the insertion profiles hold the shim elements in the channel along the channel axis. In other words, the insertion profiles mechanically hold the end shim elements, which then hold the shim elements in the channel. While the end shim elements may be placed by sliding them laterally into the insertion profiles, the shim elements may be entered along the transverse direction into the shim pocket. Once the shim pocket is filled with the shim elements that rest on top of each other and on the end shim element at the bottom, the channel may be closed by laterally sliding in the end shim element at the top. Then the shim elements are secured between the end (top and bottom) shim elements, the latter being secured in the insertion profiles. Preferably, the end shim elements are flush with the top and bottom. This configuration maximises the available shim volume.

These and other aspects of the invention will be further elaborated with reference to the embodiments defined in the dependent Claims.

In an example of the shim tray of the invention, the insertion profiles are longitudinal indents in the lateral side walls of the channel of the shim pocket. In this way, the insertion profiles are made as an integral part of the lateral side walls. The indents extend laterally along the lateral side walls. This is easy to manufacture.

In a further example, the opposite side walls are parallel, so as to fit rectangular end shim elements to be easily slid laterally into the insertion profiles.

In a further example, lateral side walls extend laterally between the longitudinal rails. The longitudinal rails match with shim channels in the magnet structure and allow the shim tray to easily slide into the shim channels of the magnet structure. The lateral side walls and the longitudinal rails form the lateral and longitudinal side walls, respectively of the individual channels. That is, the shim tray of the invention has parallel longitudinal rails that form the longitudinal side walls of each of the shim pockets. The longitudinal side walls of the each of the shim pockets are a part of one of the longitudinal rails. This construction renders the shim tray of the invention easy to manufacture. The longitudinal rails and lateral side walls may be formed as an integral unit that is simple and inexpensive to manufacture. The longitudinal rails and the lateral side walls extend longitudinally and laterally, respectively to form the open channels of each of the shim pockets that has a transverse length to house a number of shim elements between the respective end shim elements. This integral unit may be manufactured seamlessly by injection moulding of plastic.

In a further example, the end shim element(s) may be provided with a protrusion that corresponds with the indents. In position, the protrusions are orientated longitudinally as are the indents in the lateral side walls. The indents are indented longitudinally in the lateral side walls and extend laterally. The combination of the longitudinal protrusions and the longitudinal indents form a secure clamp of the end shim element, while that end shim element can be comfortable slid laterally in position. Once in position, the end shim element may be held firmly in position in its indents. The end shim element may be further secured in position in that it makes an interference fit with the indent, so that the shim elements needs to be slid into position with a little pressure. Once the end shim element(s) are firmly fixed in position, the end shim elements (and consequently also the shim elements in the shim pockets) are prevented from falling out. These fixations are strong enough to resist pull of the magnetic field of the main magnet. The protrusions may be integral with the end shim element and in fact extend the longitudinal size of the end shim elements relative to the shim elements. Alternatively, the protrusions may be shaped to fit into the indents while the lateral side walls support the body of the end shim elements when in position with its protrusions lodged in the indents. Because the end shim elements act both to shim the magnetic field and to cover the shim pocket (and no separate e.g. plastic lid is required), the space in the shim pocket is used more efficiently for shimming.

These and other aspects of the invention will be elucidated with reference to the embodiments described hereinafter and with reference to the accompanying drawing wherein

BRIEF DESCRIPTION OF THE DRAWINGS

FIG. 1a shows a schematic top view of an example of a shim tray of the invention;
FIG. 1b shows a volumetric view of a part of the shim tray of FIG. 1a.

DETAILED DESCRIPTION OF THE EMBODIMENTS

Figure 2:
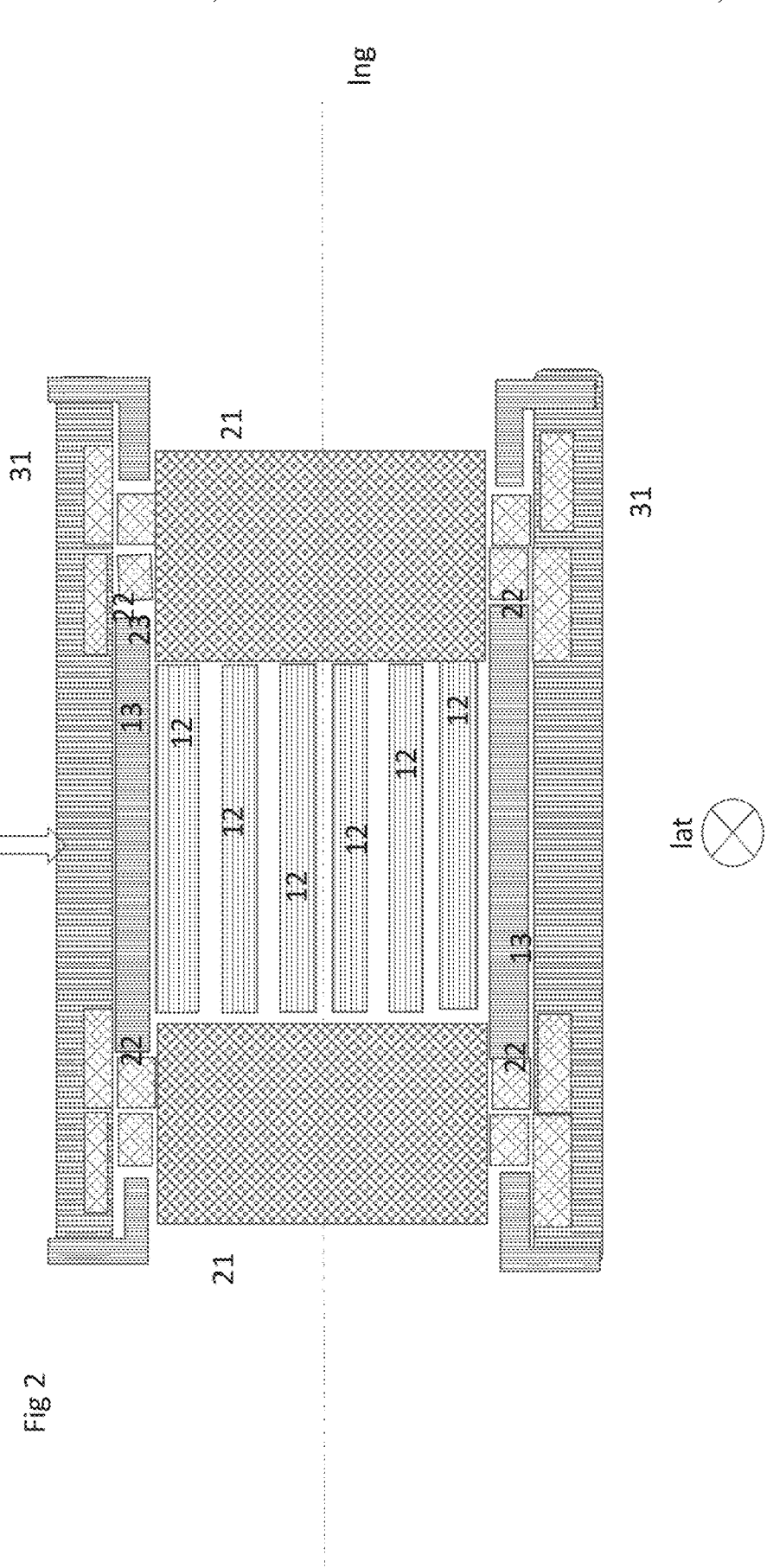
FIG. 2 shows a schematic side elevation of a part of an example of the shim tray of the invention.

FIG. 1a shows a schematic top view of an example of a shim tray 10 of the invention. The longitudinal rails 41 extend parallel to each other along the longitudinal axis (lng). Lateral side walls 21 extend laterally (lat) between the longitudinal rails 41 and form open channels in the transverse direction (tr). An individual open channel is bounded by two of the lateral side walls 21 and two opposite longitudinal side walls 42 of the respective longitudinal rails 41. The open channels form the so-called shim pockets 11 to hold shim elements 12. The open channels are open in that the shim elements 12 may be inserted along the transverse direction from one or both ends. End shim elements 13 may be inserted laterally to close the shim pocket 11 to hold the shim elements 12 in position.

FIG. 1b shows a volumetric view of a part of the shim tray 10 of FIG. 1a during mounting of the shim elements in the shim tray, as its shim pockets 11 are being filled with the shim elements. Several of the shim pockets 11 are shown, each filled with the shim elements and closed with its end shim element. The most to the right shim pocket 11 is shown empty providing a view along the transverse axis into the open channel. One shim element 13 is shown still outside of the open channel as it is being moved along the transverse direction into the channel to be lodged in position in the shim pocket 11.

FIG. 2 shows a schematic side elevation of a part of an example of the shim tray of the invention. FIG. 2 shows the shim tray of the invention as viewed along the longitudinal direction and the plan of the drawing is in the transverse-lateral plane. The example of FIG. 2 shows two end shim elements 13 each at an end of the open channel forming the shim pocket 11. Shim elements 12 (by way of example six shim elements are shown) are located in the shim pocket 11 and firmly clamped between the respective end shim elements 13 at either sides of the open channel and hence covering the openings of the channel forming the shim pocket 11.

At the transverse ends of the lateral side walls 21, indents (insertion profiles) 22 are shown that are indented longitudinally in lateral side walls 21 and extend laterally. The end shim elements 13 can be slid along the lateral directions into the insertion provided where they are held in position in the indents 22. Thus the shim elements 12 are held firmly in position between the end shim elements 13, which in turn are held in position because their longitudinal extensions fit snugly in the indents 22. The (end) shim elements 12, 13 are firmly fixed and the fixation resists pull of the magnetic field of the main magnet. Thus the (end) shim elements 12, 13 cannot come out of the shim pockets 11 and this makes mounting of the shim tray 10 easier while the magnet is at field. The end shim elements 13 clamp the shim elements 12 between them and the end shim elements 13 are secured by their protrusions 23 in the respective indents 22 so that the end shim elements 13 cannot fall out or be pulled out my the magnetic forces during mounting.

To close the open channel of the shim pocket 11 to protect the shim elements from corrosion, plastic covers 31 may be provided over the openings of the shim pocket 11 and clamped to the structure of the shim tray 10. These separate plastic covers 31 may be dispensed with and the end shim elements 13 closing the open channel of the shim pocket 11.

The protrusions 23 of the end shim elements 13 may make an interference fit with the indents 22 so that the end shim elements 13 are clamped into the indents 22 and remain securely in position.

Figure 3:
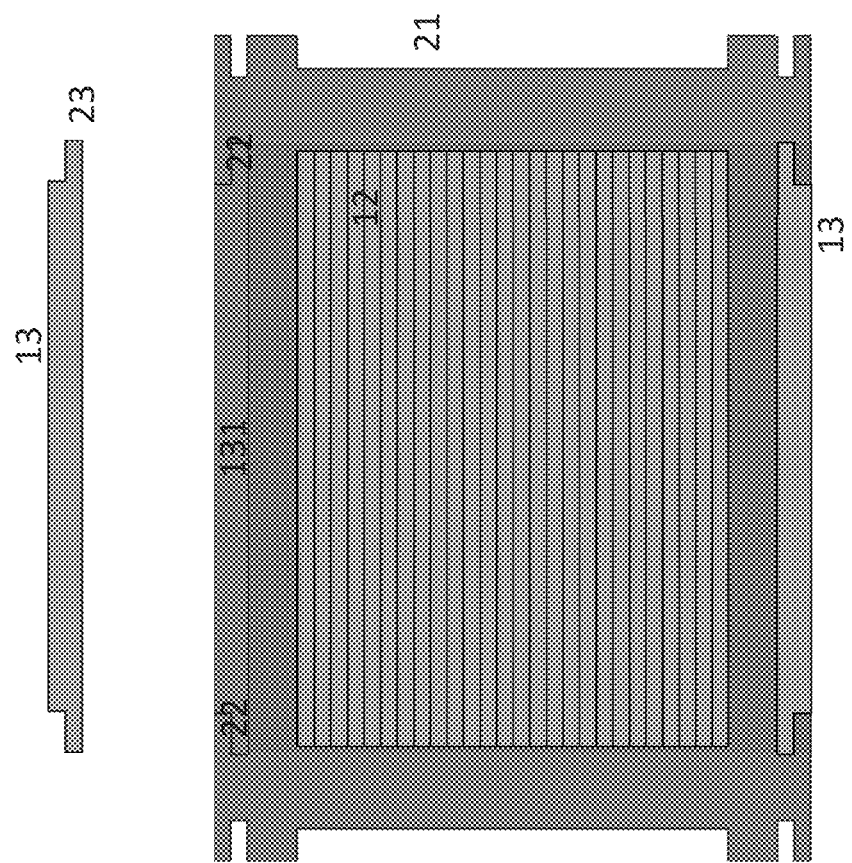
FIG. 3 shows a schematic side elevation of a part of another example of the shim tray of the invention.

FIG. 3 shows a schematic side elevation of a part of an example of the shim tray of the invention. FIG. 3 shows a further detail on the insertion profiles and further preferred shape of the end shim element 13. The example of the shim tray of FIG. 3 has twenty-six shim elements 12 and end shim elements 13 at both ends of the open channel. At both channel ends there is an end shim element 13 with protrusions 23 that fit into lateral indents 22 in the lateral sides walls 21 at respective channel ends. One end shim element 13 at the bottom is shown in position in its indents 22, another end shim element 13 at the top is shown not yet in position. This end shim element 13 at the top is to be slid in position in its space 131 with its protrusions 23 lodged in the indents 22. As shown in FIG. 3, the viewer sees the space for the end shim element 13 bounded at its lateral rear end by the longitudinal side wall 42. Each end shim element 13 is provided with a protrusion 23 along the lateral direction and extending longitudinally. The shape of the protrusion 23 corresponds with the shape of the lateral indent 22 and the lateral side wall 21. In this embodiment, the lateral side walls 21 strongly support the end shim element 13 in its position so that it can withstand pull by the magnetic field. The protrusions 23 fall in the indents 22 and the body of the end shim element 13 rests firmly against the lateral side wall 21. This provides very good support to withstand the magnetic forces that pull onto the ferromagnetic end shim elements 13 during mounting and when in position. At the top end of the channel the end shim element 13 is also shown when not mounted in the indents so that the shape of the protrusions 23 is rendered more clearly visible.

The invention claimed is:

1. A shim tray comprising:
a plurality of shim pockets, wherein each shim pocket is defined by lateral side walls extending in a lateral direction and longitudinal side walls extending in a longitudinal direction to form an open channel configured to receive a plurality of ferromagnetic shim elements, wherein the lateral side walls have insertion profiles configured to receive an end shim-element of the plurality of ferromagnetic shim elements at least at one end of the shim pocket for holding remaining shim elements of the plurality of ferromagnetic shim elements in position, and wherein the end shim element has protrusions that correspond with the insertion profiles.

2. The shim tray of claim 1, wherein when the insertion profiles receive said end shim-element at least at one end of the shim pocket, the end shim-element is inserted into the insertion profiles along the lateral direction such that the shim pocket is closed at the at least one end.

3. The shim tray of claim 1, wherein the insertion profiles are formed as longitudinal indents in the lateral side walls.

4. The shim tray of claim 1, wherein at least one of the insertion profiles is open at its lateral end.

5. The shim tray of claim 1, wherein at least one shim pocket of the plurality of shim pockets has insertion profiles at both ends of the lateral side walls.

6. The shim tray of claim 1, wherein the lateral side walls are parallel.

7. The shim tray of claim 6, wherein the longitudinal side walls are formed by parallel longitudinal rails configured to laterally hold the plurality of ferromagnetic shim elements, and wherein the parallel longitudinal rails longitudinally connect the lateral side walls.

8. The shim tray of claim 7, wherein the lateral side walls extend laterally between the parallel longitudinal rails, and the lateral and longitudinal side walls delimit the open channels of the respective plurality of shim pockets.

9. A shim tray comprising:
a plurality of longitudinal rails extending in a longitudinal direction;
a plurality of lateral side walls extending in a lateral direction between the plurality of longitudinal rails; and
a plurality of shim pockets formed by opposing lateral side walls of the plurality of lateral side walls and opposing longitudinal side walls of the plurality of longitudinal rails between the opposing lateral side walls, wherein each shim pocket of the plurality of shim pockets is configured to receive a plurality of ferromagnetic shim elements, including an end shim element positioned at a first end of the shim pocket for holding remaining shim elements of the plurality of ferromagnetic shim elements in position, wherein the end shim element has protrusions corresponding with indents in the opposing lateral side walls of the shim pocket configured to secure the end shim element in place.

10. The shim tray of claim 9, wherein the protrusions make an interference fit with the indents so that the end shim element is clamped into the indents.

11. The shim tray of claim 9, wherein the plurality of ferromagnetic shim elements further include another end shim element positioned at a second end of the shim, wherein the another end shim element has protrusions corresponding with indents in the opposing lateral side walls of the shim pocket configured to secure the another end shim element in place.

12. The shim tray of claim 9, wherein the end shim element includes an inner surface facing toward the remaining shim elements and an outer surface facing away from the remaining shim elements, wherein each protrusion of the end shim element is a portion of a thickness of the end shim element, beginning at the inner surface, and extends longitudinally into each indent.

13. The shim tray of claim 9, wherein at least one of the indents is open at a lateral end.

14. The shim tray of claim 9, wherein at least one shim pocket of the plurality of shim pockets has indents at both ends of the lateral side walls.

15. The shim tray of claim 9, wherein the opposing lateral side walls of each shim pocket are parallel.

16. The shim tray of claim 15, wherein the plurality of longitudinal rails are parallel.

* * * * *